United States Patent
Shih et al.

(10) Patent No.: US 11,540,406 B2
(45) Date of Patent: Dec. 27, 2022

(54) DISPLAY STAND HOLDER AND DISPLAY APPARATUS THEREOF

(71) Applicant: GIGA-BYTE TECHNOLOGY CO., LTD., New Taipei (TW)

(72) Inventors: Po-Jen Shih, New Taipei (TW); Chien-Min Wang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 42 days.

(21) Appl. No.: 17/386,563

(22) Filed: Jul. 28, 2021

(65) Prior Publication Data
US 2022/0039276 A1 Feb. 3, 2022

(30) Foreign Application Priority Data

Aug. 3, 2020 (TW) ................................. 109126256

(51) Int. Cl.
*F16M 11/04* (2006.01)
*H05K 5/02* (2006.01)
*F16M 11/10* (2006.01)
*H05K 5/00* (2006.01)

(52) U.S. Cl.
CPC ......... *H05K 5/0221* (2013.01); *F16M 11/046* (2013.01); *F16M 11/10* (2013.01); *H05K 5/0017* (2013.01); *H05K 5/0234* (2013.01); *F16M 2200/024* (2013.01); *F16M 2200/028* (2013.01)

(58) Field of Classification Search
None
See application file for complete search history.

(56) References Cited

U.S. PATENT DOCUMENTS

| 7,506,850 | B2 * | 3/2009 | Chang | F16M 11/2021 |
| | | | | 248/221.11 |
| 7,621,490 | B2 * | 11/2009 | Tseng | F16M 11/046 |
| | | | | 248/404 |
| 7,628,361 | B2 * | 12/2009 | Gan | F16M 11/24 |
| | | | | 248/162.1 |
| 8,111,507 | B2 * | 2/2012 | Chou | F16M 11/30 |
| | | | | 361/679.02 |
| 8,201,784 | B2 * | 6/2012 | Tang | F16M 11/10 |
| | | | | 248/162.1 |

(Continued)

FOREIGN PATENT DOCUMENTS

TW 200946809 A 11/2009

*Primary Examiner* — Xanthia C Cunningham
(74) *Attorney, Agent, or Firm* — Idea Intellectual Limited; Margaret A. Burke; Sam T. Yip

(57) ABSTRACT

A display stand holder includes a stand member, a base, a pivot member, and a latch device. The stand member is configured to be disposed on a planar surface. The lower end of the stand member is configured to be disposed on the planar surface. The base is slidably disposed in the stand member. The pivot member includes a mounting plate and at least one pivot plate. The pivot plate is pivotally connected to the base. The latch device includes a stop pin and an actuator. The stop pin is normally embedded into the limiting notch to limit a range of rotation of the pivot member relative to the base. The actuator is configured to push the stop pin to escape from the limiting notch, allowing the pivot member to further rotate to cause the mounting plate to be parallel to the planar surface.

30 Claims, 19 Drawing Sheets

(56) References Cited

U.S. PATENT DOCUMENTS

| | | | | |
|---|---|---|---|---|
| 8,228,668 | B2* | 7/2012 | Asamarai | F16M 11/046 |
| | | | | 361/679.05 |
| 9,046,214 | B2* | 6/2015 | Chang | F16M 11/046 |
| 9,279,537 | B2* | 3/2016 | Hung | F16M 11/425 |
| 9,702,501 | B2* | 7/2017 | Ho | F16M 11/2014 |
| 9,717,328 | B1* | 8/2017 | Tsai | F16M 11/18 |
| 10,638,620 | B2* | 4/2020 | Huang | F16M 11/10 |
| 2006/0219849 | A1* | 10/2006 | Chiu | F16M 11/2021 |
| | | | | 248/917 |
| 2007/0262210 | A1* | 11/2007 | Oh | F16M 11/28 |
| | | | | 248/917 |
| 2009/0256047 | A1* | 10/2009 | Zhao | F16M 11/2014 |
| | | | | 248/161 |
| 2010/0252695 | A1* | 10/2010 | Liu | F16M 11/2021 |
| | | | | 248/122.1 |
| 2012/0199711 | A1* | 8/2012 | Tsai | F16M 13/022 |
| | | | | 248/220.22 |
| 2013/0075546 | A1* | 3/2013 | Peng | F16M 11/28 |
| | | | | 248/176.1 |
| 2019/0101240 | A1* | 4/2019 | Hsu | F16M 11/42 |

* cited by examiner

DISPLAY STAND HOLDER AND DISPLAY APPARATUS THEREOF

CROSS-REFERENCE TO RELATED APPLICATION

This non-provisional application claims priority under 35 U.S.C. § 119(a) to Patent Application No. 109126256 in Taiwan, R.O.C. on Aug. 3, 2020, the entire contents of which are hereby incorporated by reference.

BACKGROUND

Technical Field

The instant disclosure relates to a display stand holder, and in particular, to a display stand holder capable of flipping a display to a horizontal state.

Related Art

A display needs to receive various electrical signal inputs such as power, video signals, and audio signals. Generally speaking, a signal input port of the display is disposed at a bottom, a side, or a back surface to receive various signal lines that are inserted.

A most direct way to insert or remove the various signal lines is to move a display body to move the signal input port to a position in front of a user. However, existing displays have a large size and a large weight, which are difficult to move for users. Another way is to move the signal input port from the bottom to the side by using a design allowing the display to be flipped to a vertical state from a horizontal state, so as to help users insert or remove the various signal lines. However, the above way can merely be used to move the signal input port from the bottom to the side, but cannot resolve a problem such as signal line insertion and removal at the back of the display. In addition, since displays having a relatively large width may come into contact with a placement plane during flipping, the displays cannot be flipped to a vertical state.

SUMMARY

In view of the above technical problems, the instant disclosure provides a display stand holder configured to be disposed on a planar surface. The display stand holder includes a stand member, a base, a pivot member, and a latch device. The stand member is configured to be disposed on the planar surface. The stand member includes an upper end and a lower end, where the lower end is configured to be disposed on the planar surface, so that the stand member is vertically disposed on the planar surface; The base is slidably disposed in the stand member. The pivot member includes a mounting plate and at least one pivot plate, where the at least one pivot plate perpendicularly extends from the mounting plate, includes a limiting notch, and is pivotally connected to the base. The latch device is disposed in the base and includes a stop pin and an actuator, and the stop pin and the actuator are movable, where the stop pin is normally embedded into the limiting notch to limit a range of rotation of the pivot member relative to the base, and the actuator is configured to push the stop pin to escape from the limiting notch, allowing the pivot member to further rotate to cause the mounting plate to be parallel to the planar surface.

In at least one embodiment of the instant disclosure, the base includes a sliding portion and at least one pivot portion, where the sliding portion is slidably disposed in the stand member, the at least one pivot portion extends from the sliding portion, and the at least one pivot plate is pivotally connected to the pivot portion.

In at least one embodiment of the instant disclosure, the stand member further includes a sliding guide portion, where the sliding portion is slidably disposed in the sliding guide portion.

In at least one embodiment of the instant disclosure, the sliding guide portion is a long groove, where the sliding portion is accommodated in the long groove.

In at least one embodiment of the instant disclosure, the display stand holder further includes a positioning device configured to fix the base at a designated position.

In at least one embodiment of the instant disclosure, the actuator includes a sliding block and an elastic member, where the sliding block is slidably disposed in the base, the elastic member is normally compressed between the sliding block and the base to push the sliding block toward the upper end, and the stop pin is disposed on the sliding block. When the mounting plate is perpendicular to the planar surface, the stop pin is movable toward the upper end to be embedded into the limiting notch.

In at least one embodiment of the instant disclosure, the display stand holder further includes an abutting column disposed on the stand member and corresponding to the upper end, where when the base is moved to the upper end, the abutting column abuts against the sliding block, so as to cause the stop pin to escape from the limiting notch.

In at least one embodiment of the instant disclosure, the base includes at least one guiding slot, and the sliding block includes at least one guiding post slidably disposed in the at least one guiding slot.

In at least one embodiment of the instant disclosure, the actuator further includes an elastic piece and a sliding switching member. The elastic piece has one end disposed on the base and an other end on which the stop pin is disposed, where the elastic piece is disposed on an outer side of the pivot portion, so that the stop pin is aligned to a perforation of the pivot portion, and the elastic piece is spaced apart from the pivot portion by a distance. The sliding switching member is movably disposed on the base to be moved between a pressed position and a released position on the base. The sliding switching member includes a positioning rod and an abutting rod, where the abutting rod is located between the elastic piece and the pivot portion, and the positioning rod is configured corresponding to the stop pin. When the sliding switching member is in the pressed position, the positioning rod normally presses the elastic piece toward the pivot portion, so that the stop pin protrudes inside the pivot portion through the perforation so as to be embedded into the limiting notch. When the sliding switching member is moved to the released position, the positioning rod is detached from the elastic piece, so that the abutting rod is moved toward the stop pin to push the elastic piece away from the pivot portion so as to cause the stop pin to escape from the limiting notch.

In at least one embodiment of the instant disclosure, the positioning rod includes an inclined guiding surface corresponding to the end of the elastic piece on which the stop pin is disposed, where when the sliding switching member is moved toward the pressed position, the end of the elastic piece on which the stop pin is disposed comes into contact with the inclined guiding surface, so that the elastic piece is guided to deform to enter a space between the positioning rod and the pivot portion.

In at least one embodiment of the instant disclosure, the perforation is configured corresponding to the limiting notch. When the mounting plate is perpendicular to the planar surface, the perforation overlaps the limiting notch.

In at least one embodiment of the instant disclosure, the base further includes an outer cover, where the sliding switching member is engaged to the outer cover to be movably disposed on the base, and the positioning rod and the abutting rod extend through at least one through hole of the outer cover.

In at least one embodiment of the instant disclosure, the actuator is a telescopic device disposed in the base, where the stop pin is disposed on the telescopic device, and the telescopic device is configured to drive the stop pin to stretch and retract, so that the stop pin is embedded into the limiting notch through a perforation of the pivot portion, or the telescopic device is capable of driving the stop pin to escape from the limiting notch.

In at least one embodiment of the instant disclosure, the perforation is configured corresponding to the limiting notch. When the mounting plate is perpendicular to the planar surface, the perforation overlaps the limiting notch.

In at least one embodiment of the instant disclosure, the pivot plate further includes a fixing notch. When the mounting plate is parallel to the planar surface, the stop pin is embedded into the fixing notch.

The instant disclosure further provides a display apparatus including the above display stand holder and a display. The display includes a front surface and a back surface, where the back surface is fixed to the mounting plate.

By virtue of the display stand holder of the instant disclosure, the display can still be effectively limited to tilt frontward and rearward by limited angles during normal use. When an electrical signal connector needs to be inserted or removed, the display can be flipped to a horizontal state only through limiting of the stop pin, so as to help a user insert and remove the electrical signal connector without a need to move and turnover the display to insert the electrical signal connector. After the insertion of the electrical signal connector is completed, the pivot member may be rotated again to restore a vertical state of the display, and the base may be lowered to adjust the display to a designated position on the stand member. The stop pin is simple to operate, and can be quickly fastened or released.

DETAILED DESCRIPTION

Figure 1:
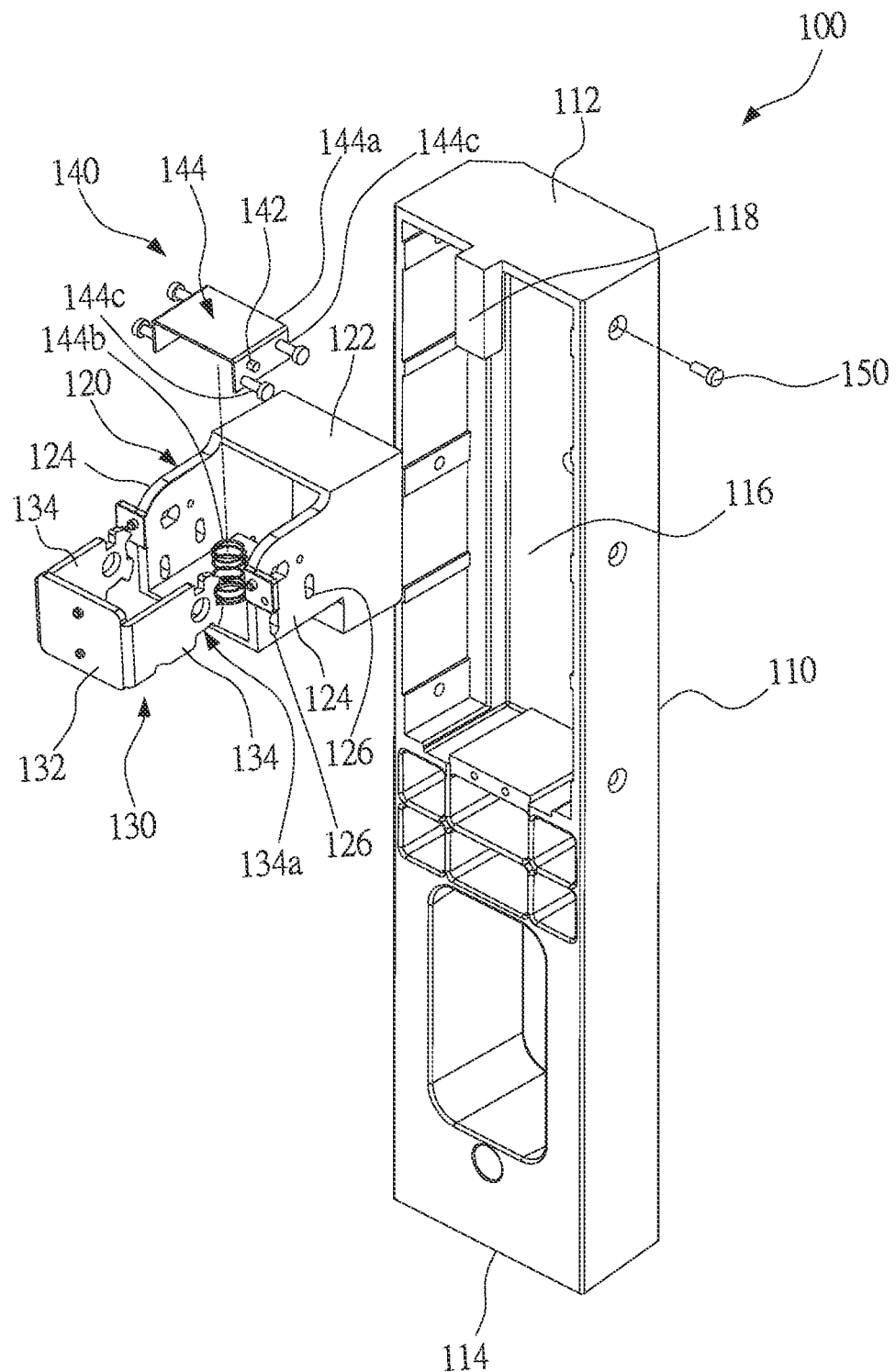
FIG. 1 is an exploded perspective view of a first embodiment according to the instant disclosure.
Figure 2:
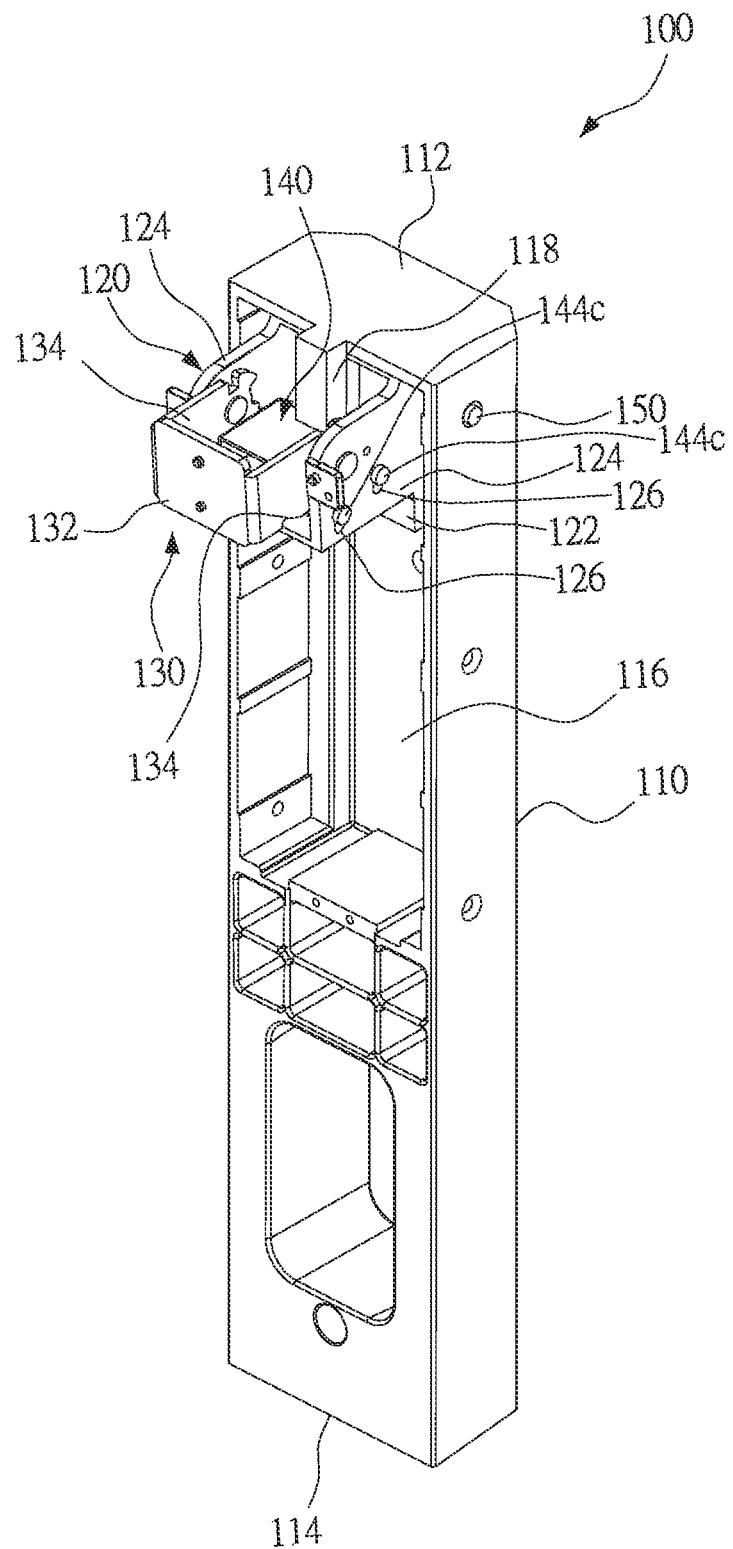
FIG. 2 is a perspective view of the first embodiment according to the instant disclosure.
Figure 3:
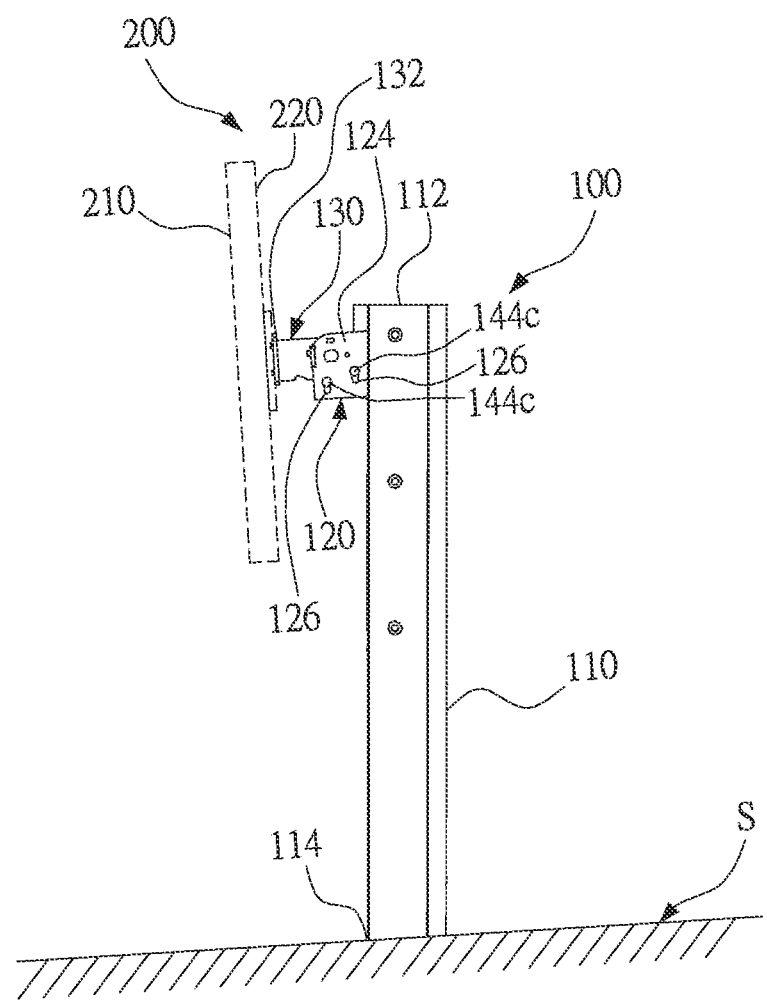
FIG. 3 is a side view of the first embodiment according to the instant disclosure.

FIG. 1, FIG. 2, and FIG. 3 show a display apparatus according to a first embodiment of the instant disclosure, which includes a display stand holder 100 and a display 200.

As shown in FIG. 1, FIG. 2, and FIG. 3, the display stand holder 100 is configured to be disposed on a planar surface S, so as to erect the display 200 on the surface S. The display stand holder 100 includes a stand member 110, a base 120, a pivot member 130, and a latch device 140.

As shown in FIG. 1, FIG. 2, and FIG. 3, the stand member 110 includes an upper end 112 and a lower end 114. The lower end 114 is configured to be disposed on the planar surface S, so that the stand member 110 is vertically disposed on the planar surface S. The stand member 110 further includes a sliding guide portion 116 extending from the upper end 112 toward the lower end 114. The sliding guide portion 116 may be partially disposed on a section of the stand member 110 corresponding to the upper end 112, and may extend from the upper end 112 to the lower end 114.

As shown in FIG. 1, FIG. 2, and FIG. 3, the base 120 is slidably disposed in the stand member 110 and may be slid to the upper end 112. In a specific embodiment, the base 120 includes a sliding portion 122 and two pivot portions 124. The sliding portion 122 is slidably disposed on the sliding guide portion 116 of the stand member 110, and the two pivot portions 124 extend from the sliding portion 122. The sliding guide portion 116 is a long groove, and part of the base 120, that is, the sliding portion 122, is accommodated in the long groove, so that the base 120 may be slid toward the upper end 112.

As shown in FIG. 1 and FIG. 2, a positioning device 150 is disposed between the stand member 110 and the base 120 to fix the base 120 in a designated position. The positioning device 150 may be a combination of damping members, a combination of ratchets, or a fixing bolt. In the figure, a fixing bolt is taken as an example. After extending through a fixing hole of the stand member 110 from the outside of the stand member 110, the fixing bolt abuts against or extends through the base 120 to fix a position of the base 120 on the stand member 110, so that the base 120 does not fall toward the lower end 114. The fixing bolt is merely an example of the positioning device 150, and is not intended to limit an implementation of the positioning device 150.

As shown in FIG. 1, FIG. 2, FIG. 3, and FIG. 4, the pivot member 130 includes a mounting plate 132 and two pivot plates 134. The mounting plate 132 is configured to be fixed to a back surface 220 of the display 200 to connect the pivot member 130 to the display 200. The two pivot plates 134 perpendicularly extend from two opposite sides of the mounting plate 132 and are pivotally connected to the pivot portion 124 of the base 120. In addition, the pivot plates 134 each include a limiting notch 134*a*. The display 200 has a front surface 210 and a back surface 220. The back surface 220 is fixed to the mounting plate 132 of the pivot member 130, so as to rotatably connect the display 200 to the base 120. By virtue of sliding of the base 120 relative to the stand member 110, a height of the display 200 relative to planar surface S is changed.

As shown in FIG. 1, FIG. 2, FIG. 3, and FIG. 4, the latch device 140 is disposed in the base 120, and the latch device 140 includes one or more stop pins 142 and an actuator 144, and the stop pins 142 and the actuator 144 are movable. When the mounting plate 132 is perpendicular to the planar surface S, the stop pins 142 are normally embedded into the limiting notch 134*a* to limit a range of rotation of the pivot member 130 relative to the base 120.

Figure 4:
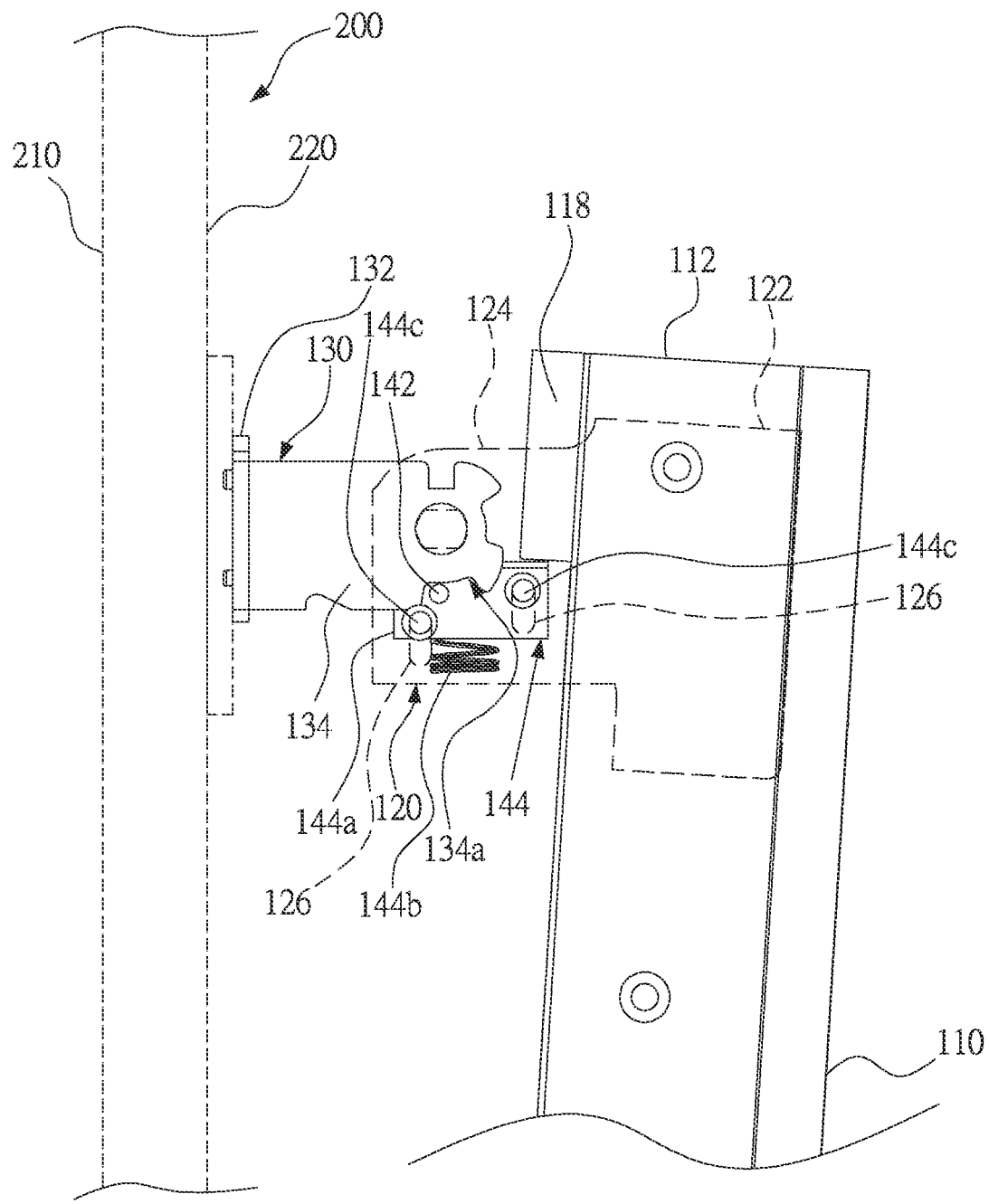
FIG. 4 is a side view of some elements according to the first embodiment of the instant disclosure.
Figure 5:
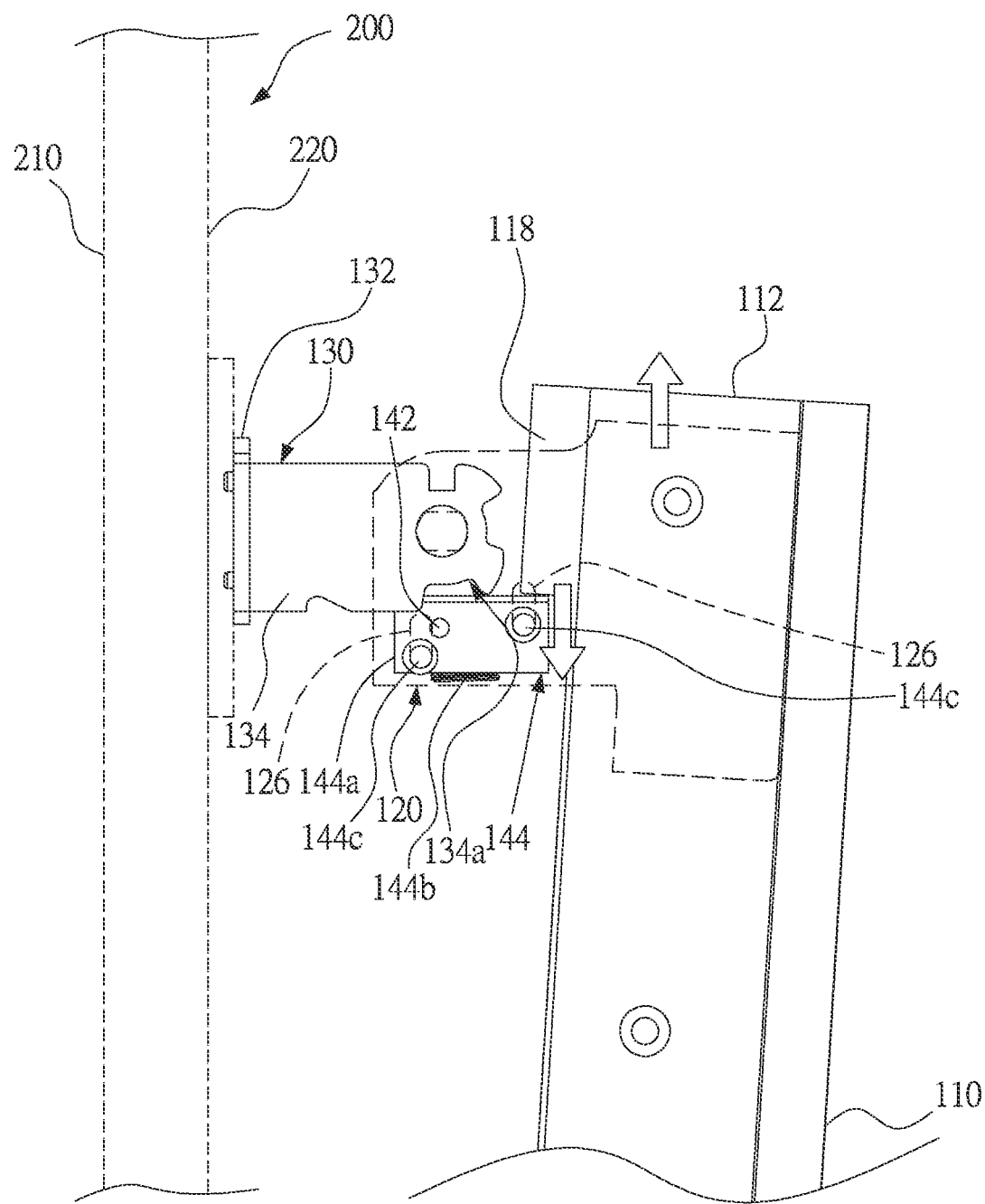
FIG. 5 is another side view of some elements according to the first embodiment of the instant disclosure.
Figure 6:
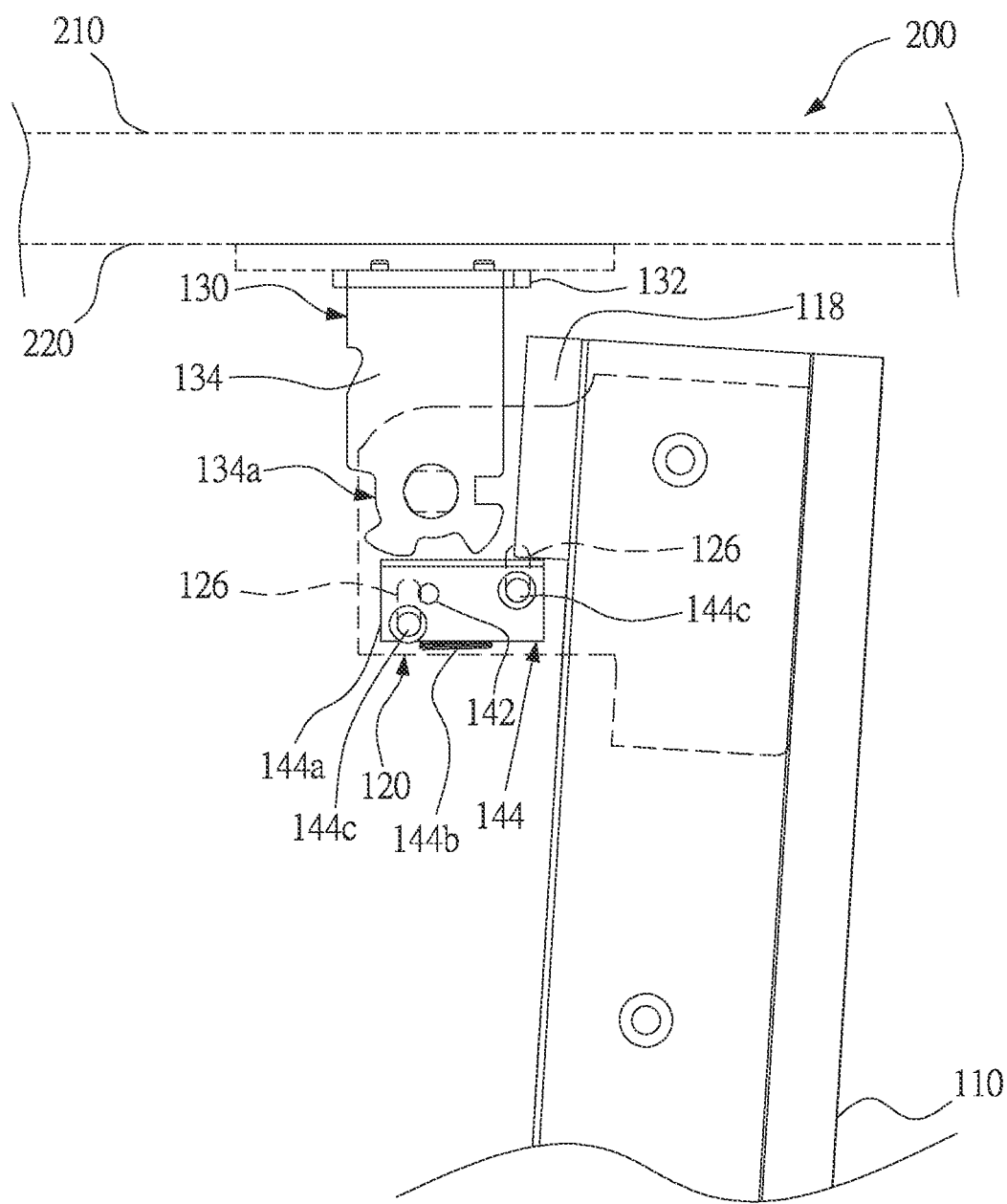
FIG. 6 is still another side view of some elements according to the first embodiment of the instant disclosure.

As shown in FIG. 4, FIG. 5, and FIG. 6, the actuator 144 is configured to move on the base 120, to push the stop pin 142 to escape from the limiting notch 134*a*, allowing the pivot member 130 to further rotate to cause the mounting plate 132 to be parallel to the planar surface S.

A number of limiting notches 134*a* and a number of stop pins 142 match each other, that is, each limiting notch 134*a* is used for embedding of one stop pin 142. In other words, only one pivot plate 134 may be configured on the pivot member 130, and only one pivot portion 124 may be configured on the base 120. At this time, the pivot member 130 provides only one limiting notch 134*a* through one pivot plate 134. In this case, only one stop pin 142 needs to be configured on the latch device 140. In addition, a width of the limiting notch 134*a* may be greater than a width of the stop pin 142. In this way, after the stop pin 142 is embedded into the limiting notch 134*a*, the pivot member 130 is still slightly rotatable to adjust a pitch state of the display 200 to match a sight of a user. Therefore, embedding the stop pin 142 into the limiting notch 134*a* is to limit the range of rotation of the pivot member 130 relative to the base 120 rather than completely fixing the pivot member 130 and the base 120.

As shown in FIG. 6, the base 120 is raised to the upper end 112, and the rotation of the pivot member 130 may be free of influence from interference between the display 200 and the stand member 110, so that the mounting plate 132 can be parallel to the planar surface S. At this time, the display 200 is also parallel to the planar surface S. The back surface 220 of the display 200 faces the planar surface S, and a bottom edge or a side edge of the display 200 is in a horizontal direction. In this case, regardless of whether a connection port of the display 200 is located on the back surface 220, the bottom edge, or the side edge, a user can conveniently insert an electrical signal connector.

Referring to FIG. 1, FIG. 2, FIG. 4, FIG. 5, and FIG. 6, the actuator 144 of the first embodiment includes a sliding block 144*a* and an elastic member 144*b*. The base 120 includes one or more guiding slots 126; The sliding block 144*a* further includes one or more guiding posts 144*c* slidably disposed in the guiding slot 126, so that the sliding block 144*a* is slidably disposed on the base 120. Specifically, the sliding block 144*a* is disposed between the two pivot portions 124 of the base 120. At least two guiding slots 126 are provided on each of the pivot portions 124. The guiding slots 126 extend in a direction perpendicular to the planar surface S. At least two guiding posts 144*c* are respectively disposed on two opposite sides of the sliding block 144*a*, which are respectively disposed in the guiding slots 126. In this way, the sliding block 144*a* can be only linearly moved relative to the base without relative rotation. The elastic member 144*b* is normally compressed between the sliding block 144*a* and the base 120 to push the sliding block 144*a* toward the upper end 112. The stop pin 142 is disposed on the sliding block 144*a*. A position of the stop pin 142 roughly corresponds to a position of the pivot plate 134. When the mounting plate 132 is perpendicular to the planar surface S, the stop pin 142 may be moved toward the upper end 112 to be embedded into the limiting notch 134*a*, and the elastic member 144*b* is configured to keep the stop pin 142 to be normally embedded in the limiting notch 134*a*.

Referring to FIG. 1, FIG. 2, FIG. 4, FIG. 5, and FIG. 6, the stand member 110 further includes an abutting column 118 disposed in the stand member 110 and corresponding to the upper end 112. The abutting column 118 extends toward the lower end 114. When the base 120 is far away from the lower end 114, the abutting column 118 is not in contact with the sliding block 144*a*, so that the stop pin 142 is kept to be embedded in the limiting notch 134*a*. At this time, the pivot member 130 may only rotate within a limited angle relative to the base 120, and a tilting state of the display 200 may be adjusted within a small angle range.

As shown in FIG. 5, when the base 120 is moved to the upper end 112, the abutting column 118 abuts against the sliding block 144*a*, so that the stop pin 142 escapes from the limiting notch 134*a*. At this time, the latch device 140 releases locking of the pivot member 130, allowing the pivot member 130 to further rotate to cause the display 200 to be parallel to the planar surface S. As shown in FIG. 4, when the mounting plate 132 is rotated again to be perpendicular to the planar surface S and the base 120 is far away from the upper end 112 again, the abutting column 118 is detached from the sliding block 144*a*, so that the stop pin 142 is embedded into the limiting notch 134*a* again to lock the pivot member 130.

Figure 7:
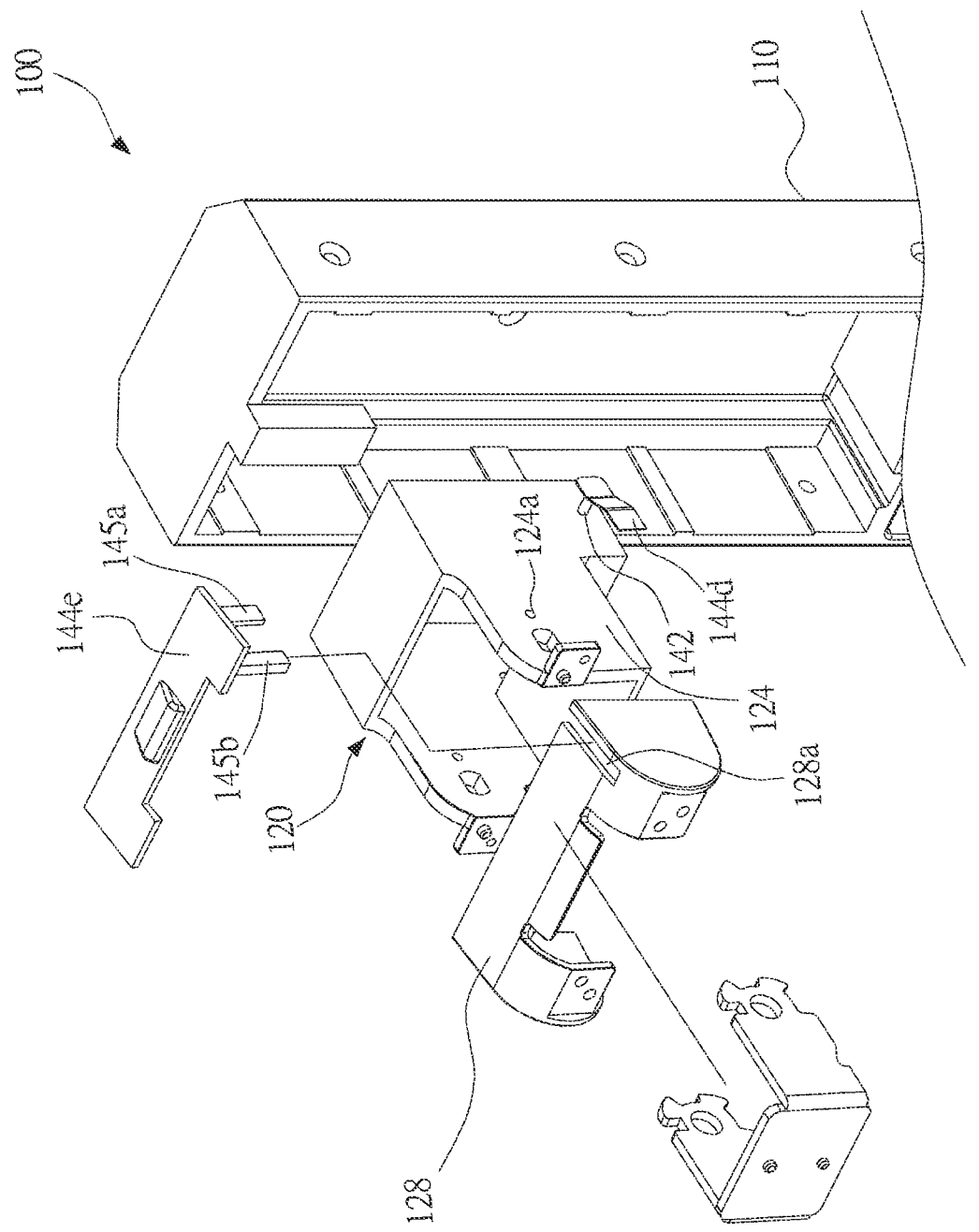
FIG. 7 is an exploded perspective view of a second embodiment according to the instant disclosure.
Figure 8:
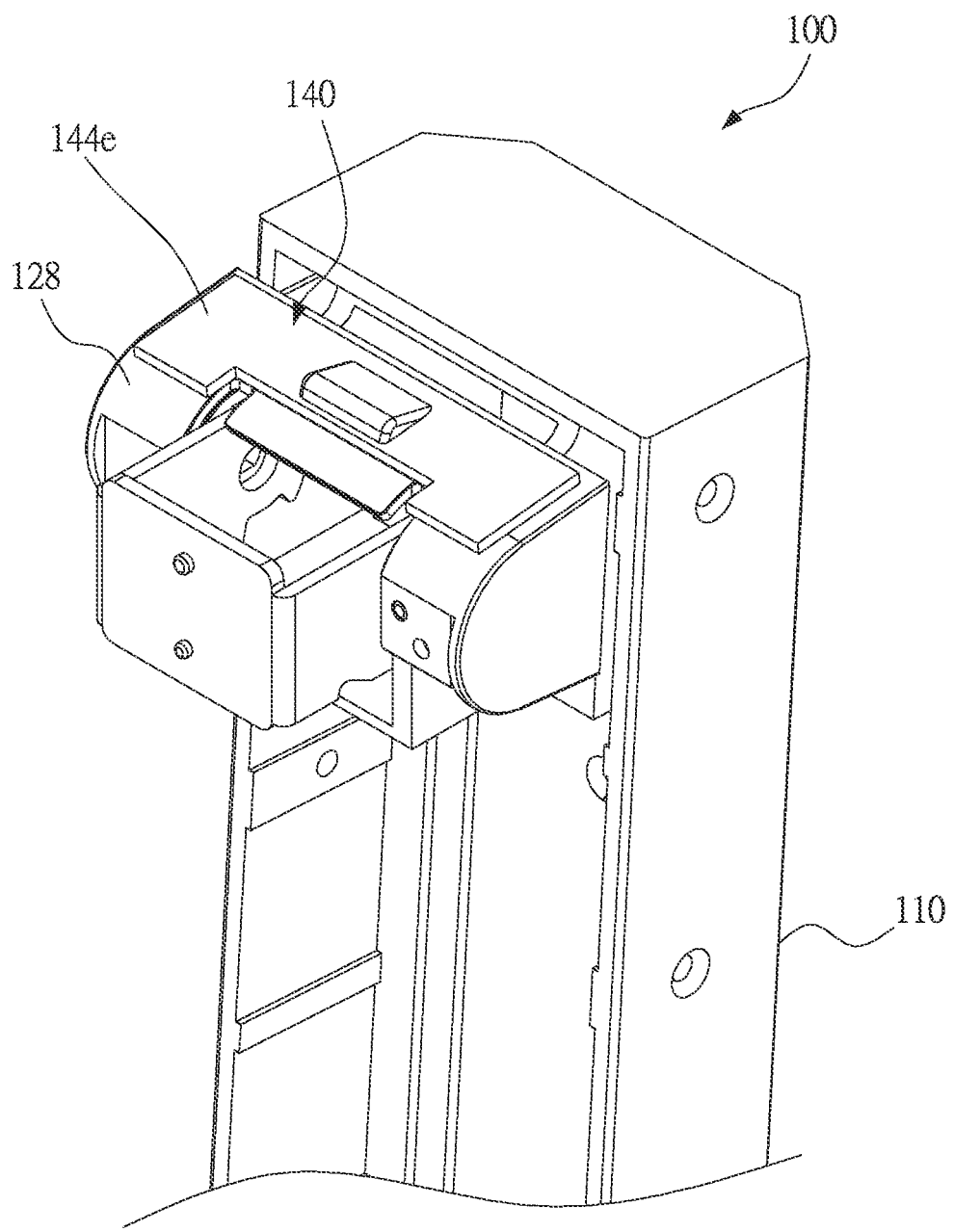
FIG. 8 is a perspective view of the second embodiment according to the instant disclosure.
Figure 9:
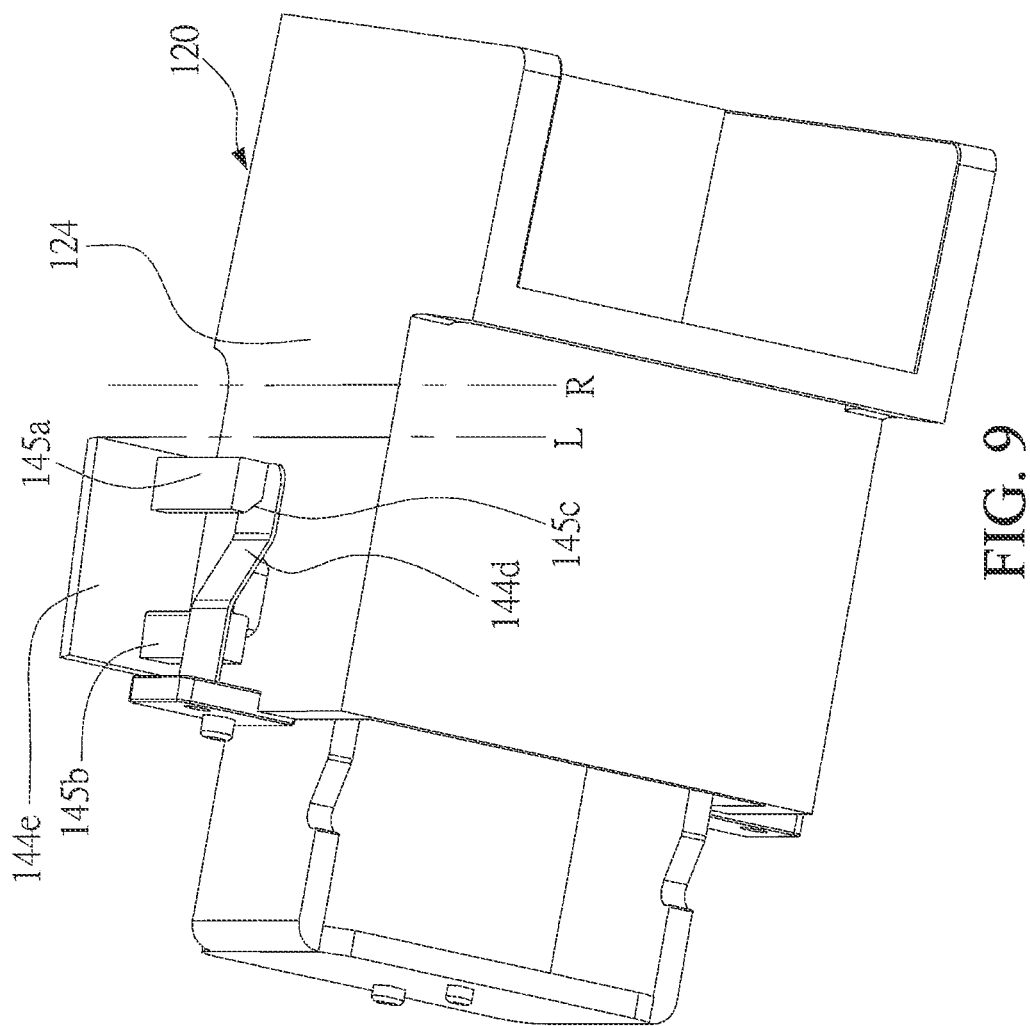
FIG. 9 is a perspective view of some elements according to the second embodiment of the instant disclosure.

FIG. 7, FIG. 8 and FIG. 9 show a latch device 140 according to a second embodiment of the instant disclosure, which is applicable to the display stand holder 100 according to one or more embodiments of the instant disclosure. In the second embodiment, the abutting column 118 of the stand member 110 is omitted.

As shown in FIG. 7, FIG. 8 and FIG. 9, the latch device 140 includes at least one stop pin 142 and an actuator, and at least one stop pin 142 and the actuator are movable. The actuator further includes at least one elastic piece 144*d* and a sliding switching member 144*e*. The elastic piece 144*d* has one end disposed on the base 120 and an other end on which the stop pin 142 is disposed. Specifically, the elastic piece 144*d* is disposed on an outer side of the pivot portion 124, so that the stop pin 142 is aligned to a perforation 124*a* of the pivot portion 124, and the elastic piece 144*d* is spaced apart from the pivot portion 124 by a distance. The base 120 further includes an outer cover 128. The sliding switching member 144*e* is engaged to the outer cover 128 to be movably disposed on the base 120.

As shown in FIG. 9, FIG. 10, FIG. 11, and FIG. 12, the sliding switching member 144*e* may be moved between a pressed position L and a released position R on the base 120. The above perforation 124*a* is configured corresponding to the limiting notch 134a. When the mounting plate 132 is perpendicular to the planar surface S, the perforation 124a overlaps the limiting notch 134a, so that the stop pin 142 can extend through the perforation 124a to be embedded into the limiting notch 134a.

Figure 11:
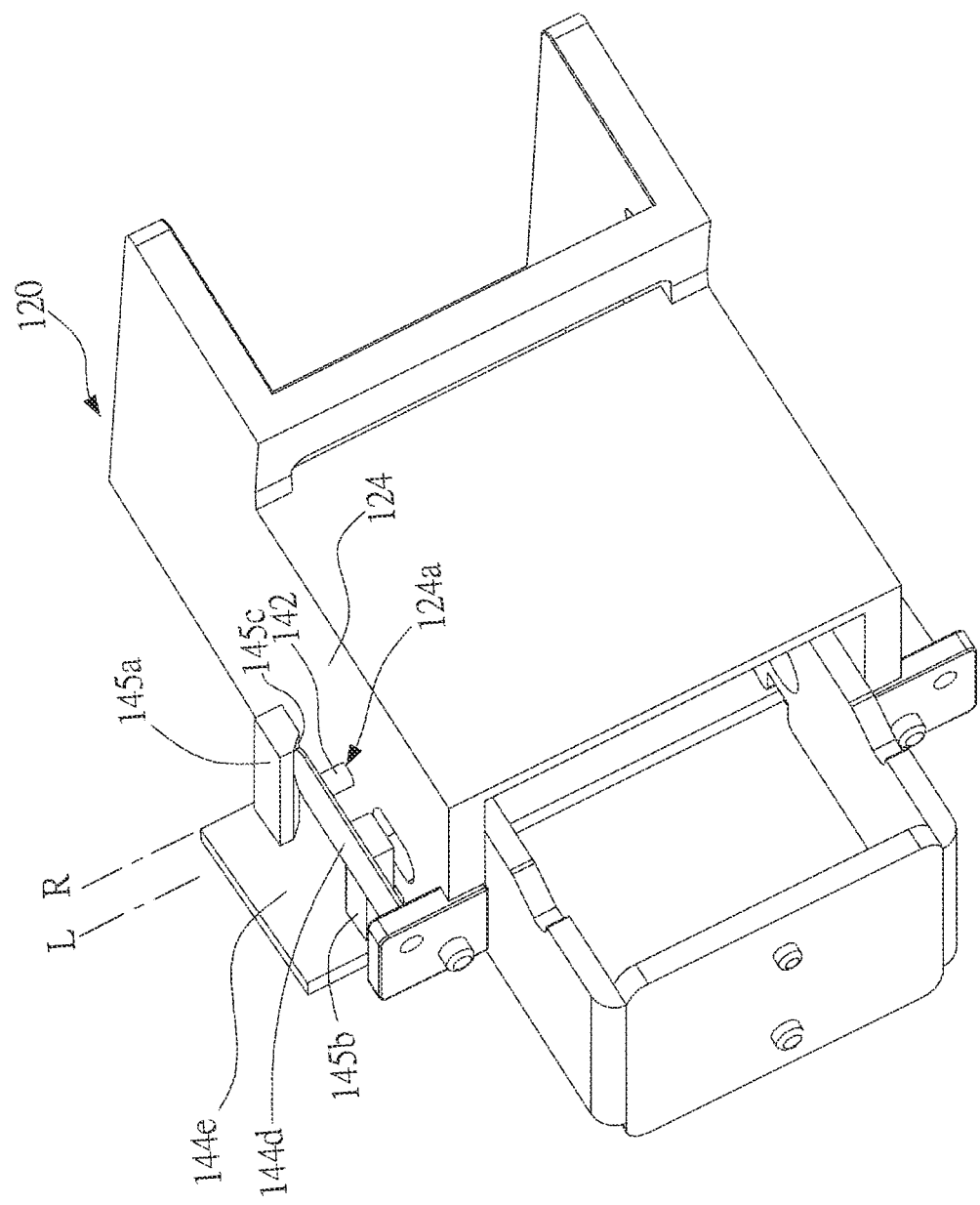
FIG. 11 is still another perspective view of some elements according to the second embodiment of the instant disclosure.

As shown in FIG. 7, FIG. 9, and FIG. 11, the sliding switching member 144e includes a positioning rod 145a and an abutting rod 145b that extend through at least one through hole 128a of the outer cover 128. The abutting rod 145b is located between the elastic piece 144d and the pivot portion 124, and the positioning rod 145a is configured corresponding to the stop pin 142.

Figure 10:
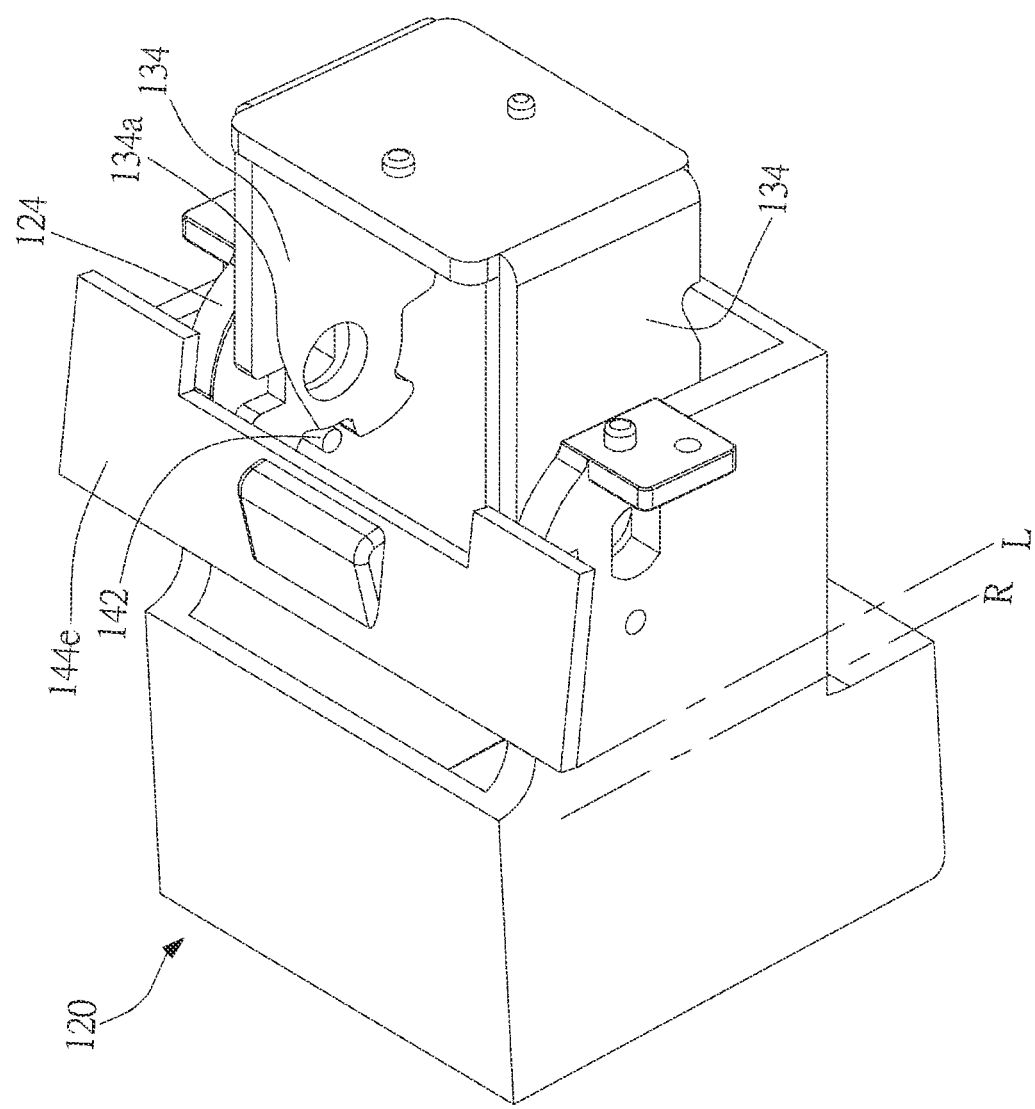
FIG. 10 is another perspective view of some elements according to the second embodiment of the instant disclosure.

As shown in FIG. 9 and FIG. 10, when the sliding switching member 144e is in the pressed position L, the positioning rod 145a normally presses the elastic piece 144d toward the pivot portion 124, so that the stop pin 142 protrudes inside the pivot portion 124 through the perforation 124a, so as to be embedded into the limiting notch 134a.

As shown in FIG. 9 and FIG. 11, the positioning rod 145a includes an inclined guiding surface 145c corresponding to the end of the elastic piece 144d on which the stop pin 142 is disposed. When the sliding switching member 144e is moved from the released position R toward the pressed position L, the end of the elastic piece 144d on which the stop pin 142 is disposed comes into contact with the inclined guiding surface 145c, so that the guiding elastic piece 144d is guided to deform to enter a space between the positioning rod 145a and the pivot portion 124. In this way, the positioning rod 145a can press the elastic piece 144d toward the pivot portion 124, thereby driving the stop pin 142 to extend through the perforation 124a to be embedded into the limiting notch 134a.

Figure 12:
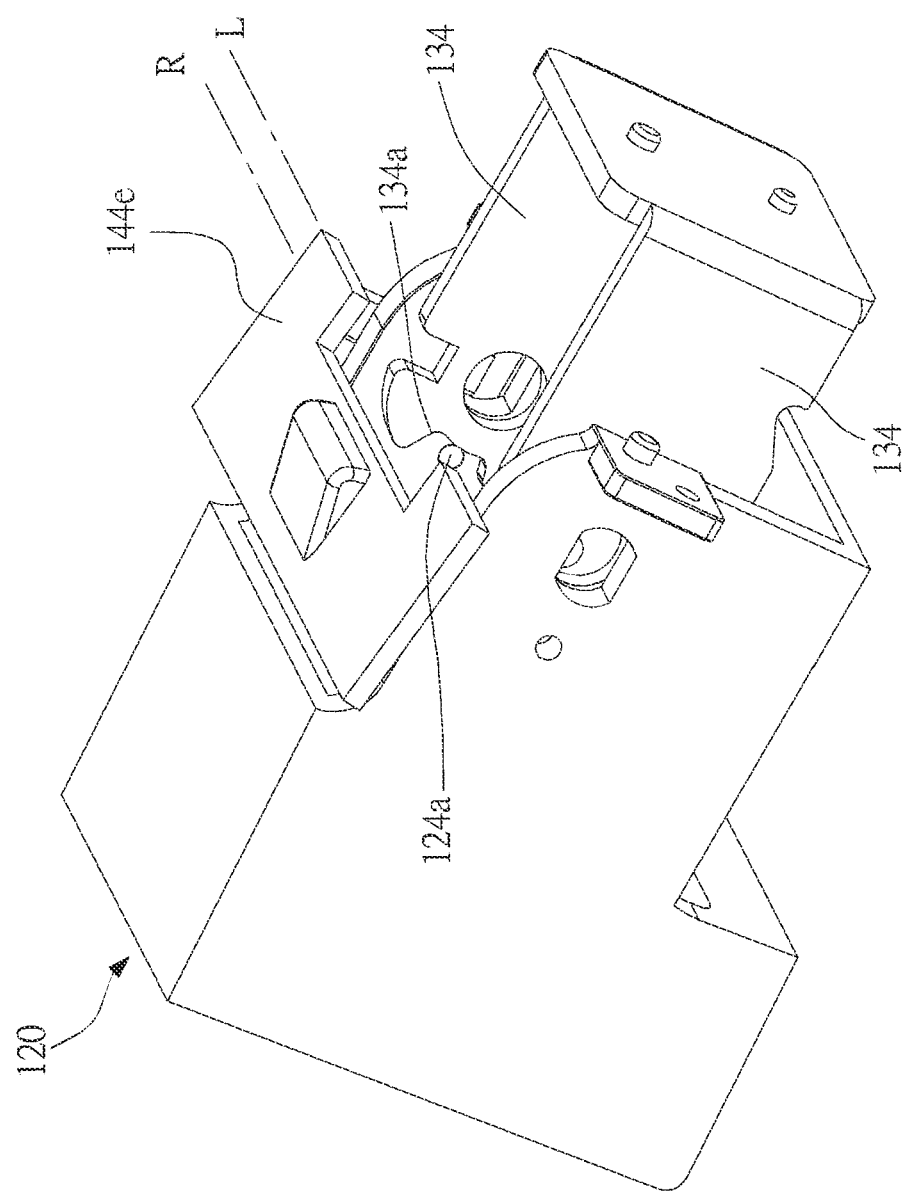
FIG. 12 is yet another perspective view of some elements according to the second embodiment of the instant disclosure.

As shown in FIG. 11 and FIG. 12, when the sliding switching member 144e is moved to the released position R, the positioning rod 145a is detached from the elastic piece 144d, and the abutting rod 145b is moved between the pivot portion 124 and the elastic piece 144d toward the stop pin 142 to push the elastic piece 144d away from the pivot portion 124, so as to cause the stop pin 142 to escape from the limiting notch 134a.

Figure 13:
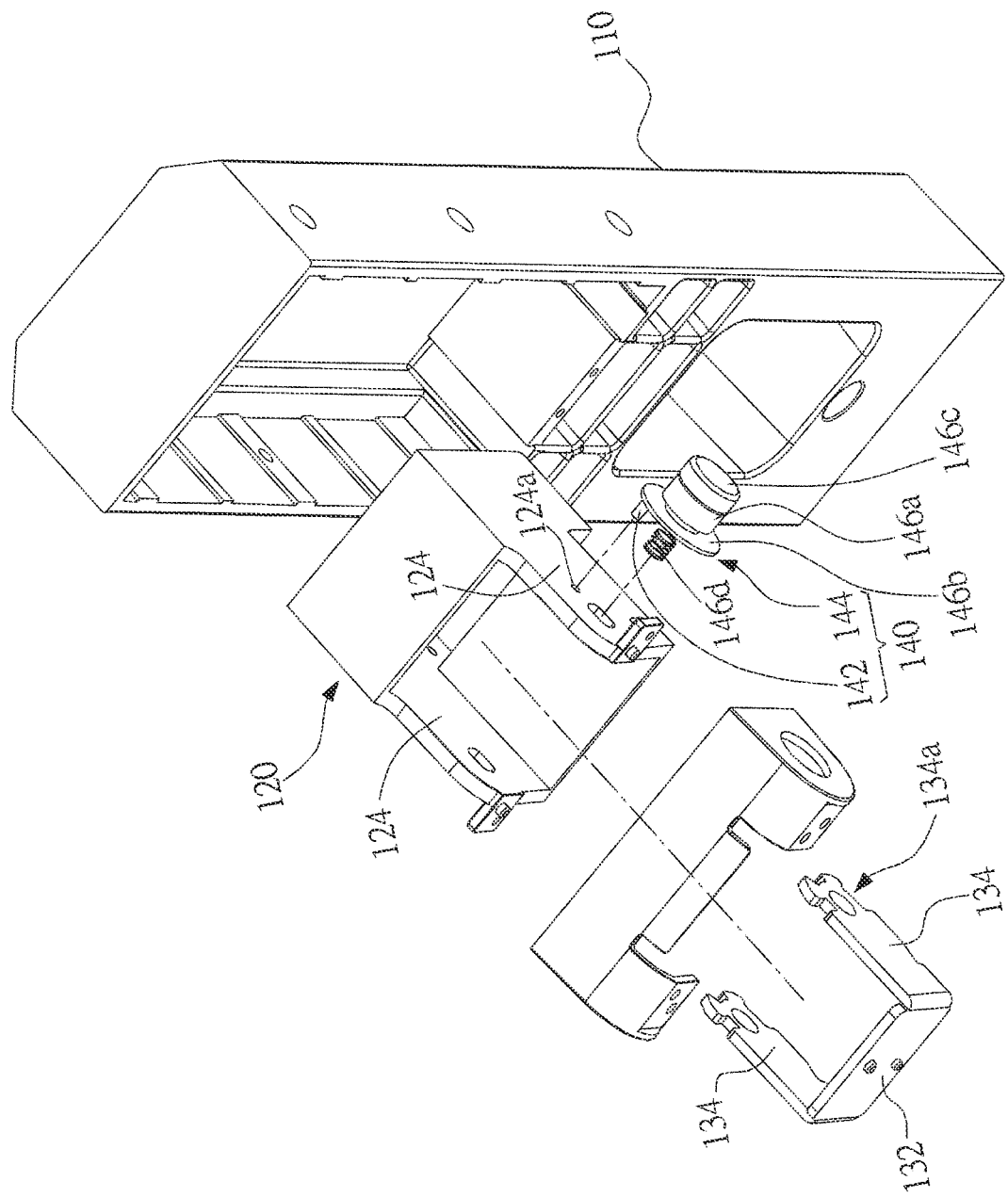
FIG. 13 is an exploded perspective view of a third embodiment according to the instant disclosure.
Figure 14:
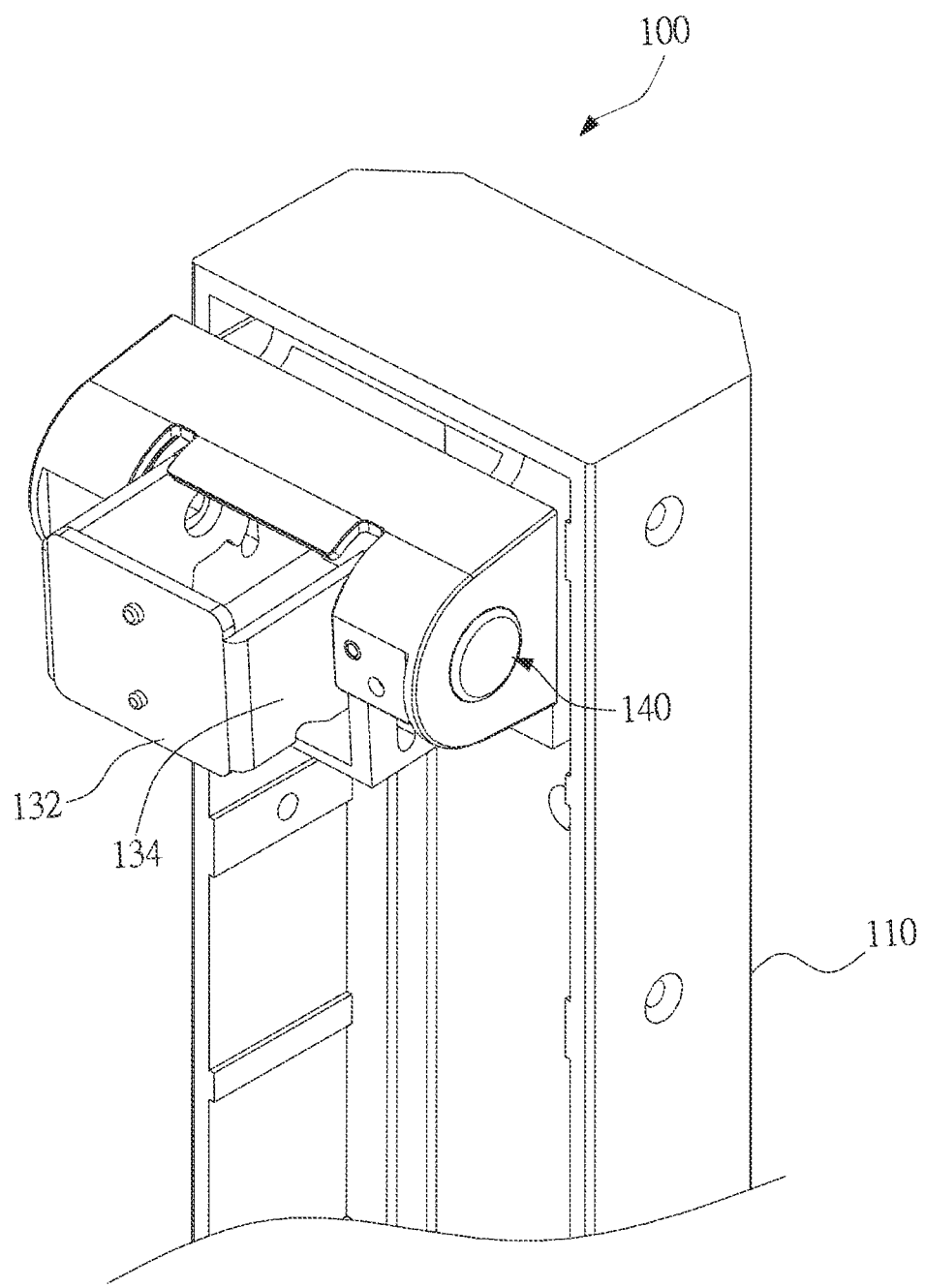
FIG. 14 is a perspective view of the third embodiment according to the instant disclosure.
Figure 15:
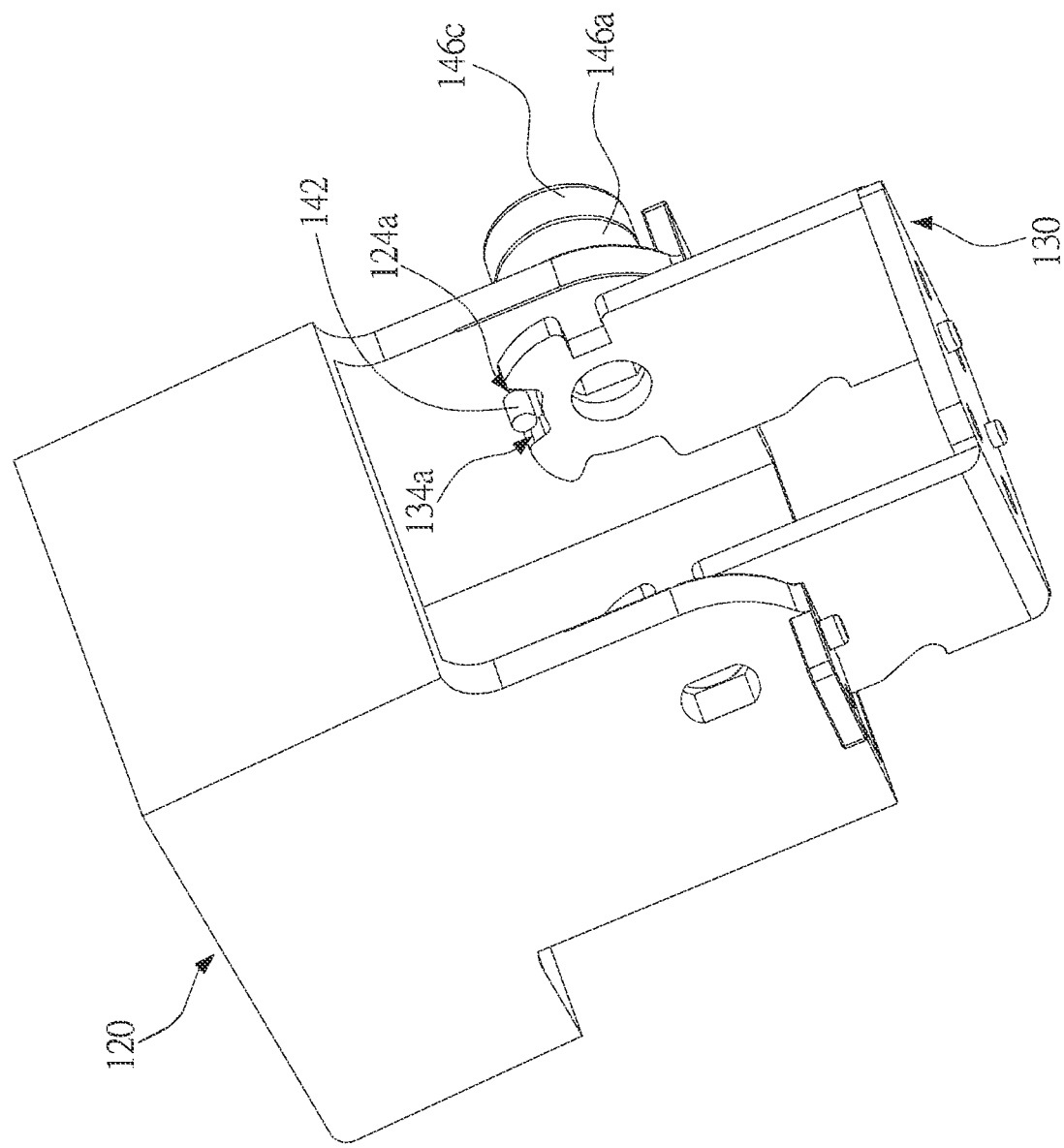
FIG. 15 is a perspective view of some elements according to the third embodiment of the instant disclosure.
Figure 16:
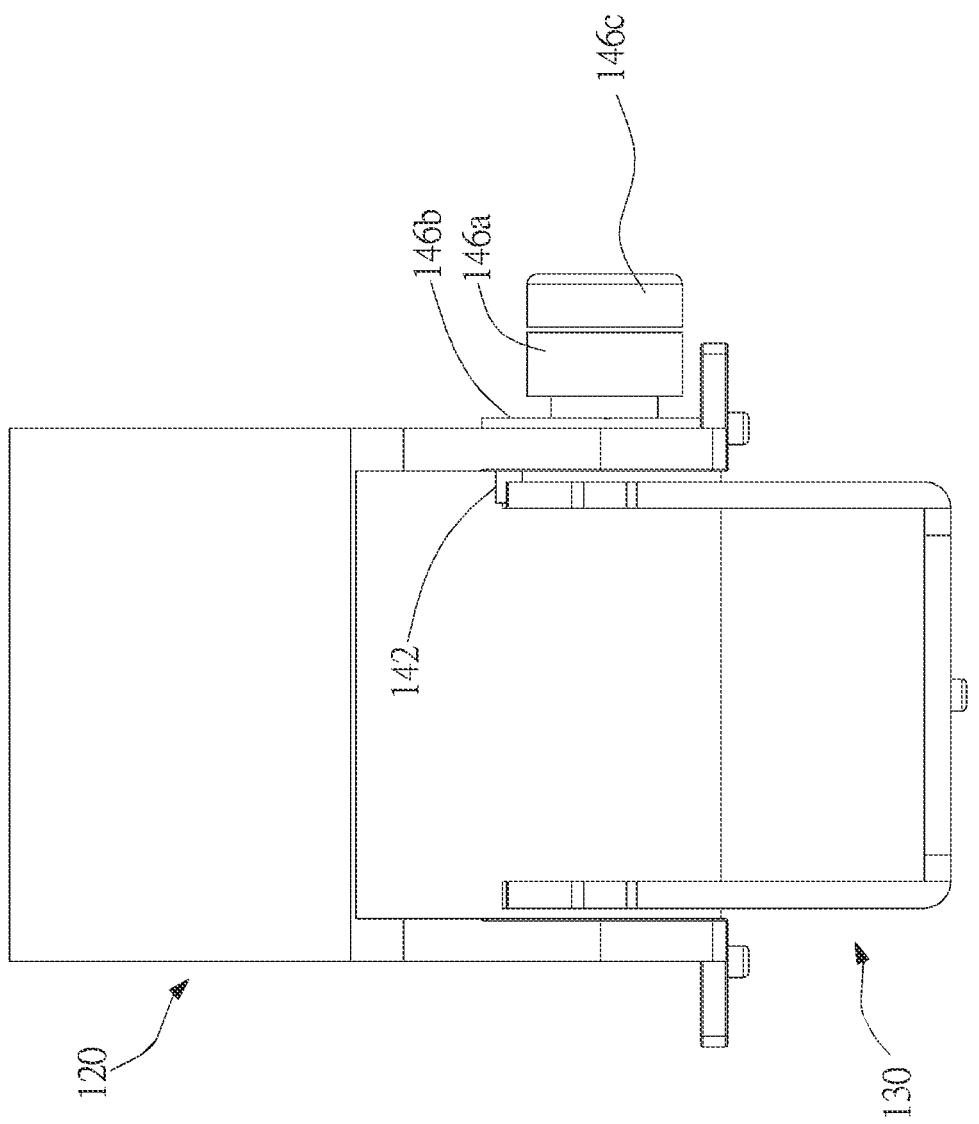
FIG. 16 is a top view of some elements according to the third embodiment of the instant disclosure.
Figure 17:
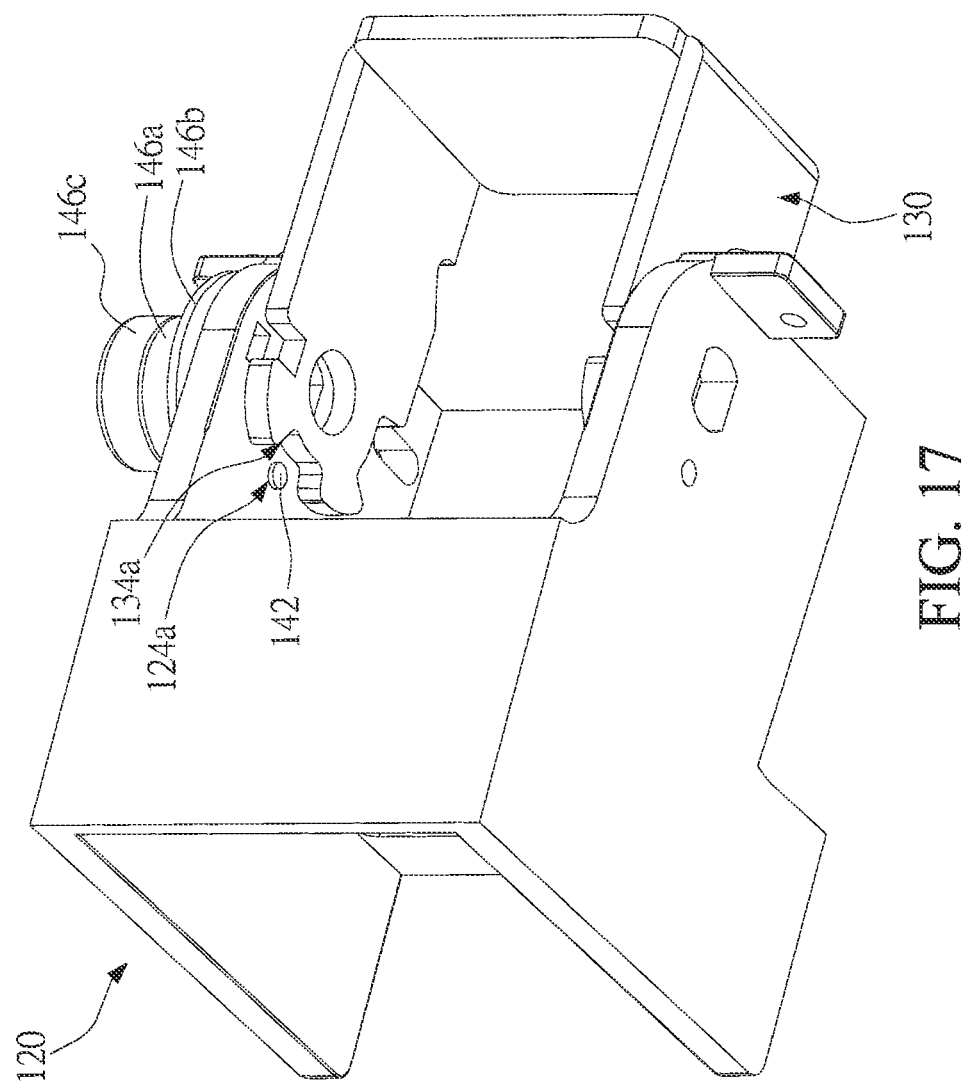
FIG. 17 is another perspective view of some elements according to the third embodiment of the instant disclosure.
Figure 18:
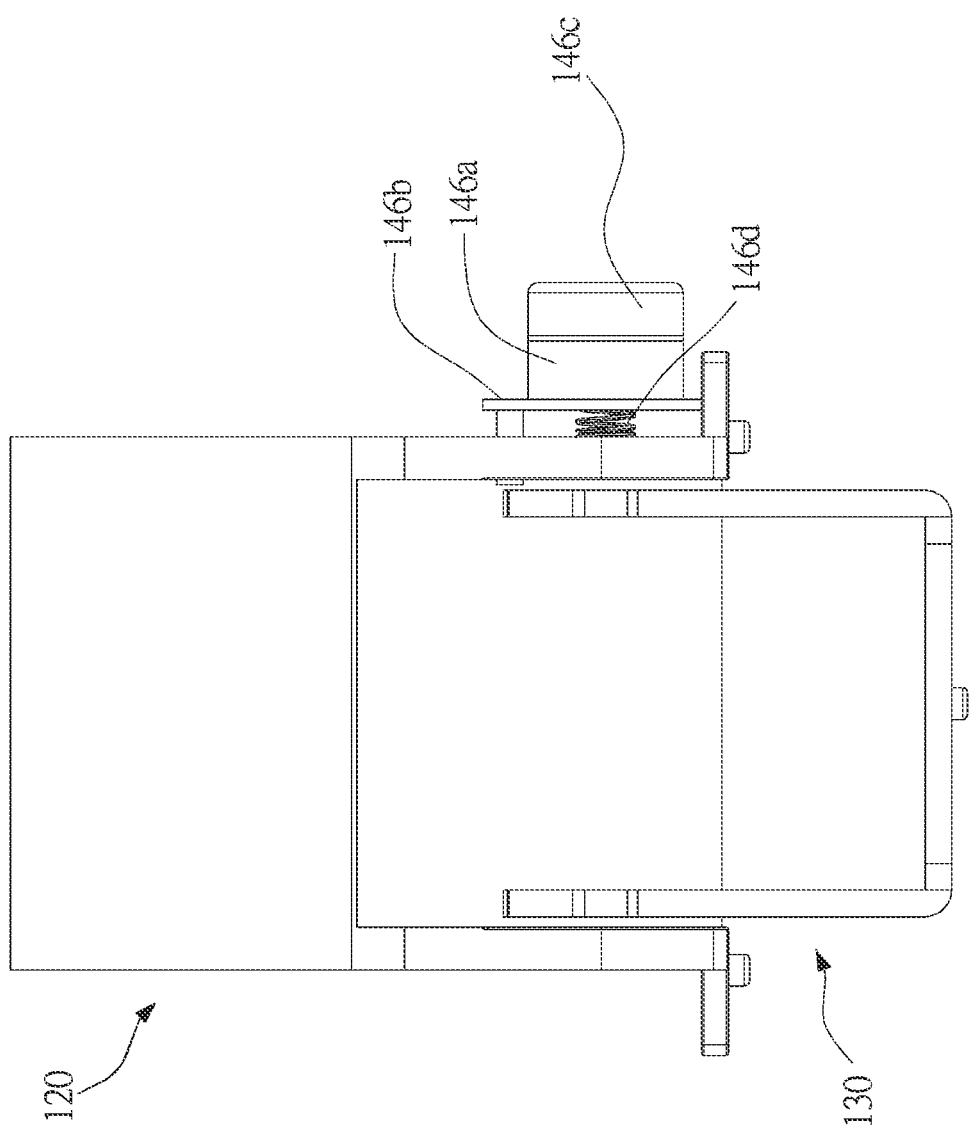
FIG. 18 is another top view of some elements according to the third embodiment of the instant disclosure.

FIG. 13 and FIG. 14 show a latch device 140 according to a third embodiment of the instant disclosure, which is applicable to the display stand holder 100 according to one or more embodiments of the instant disclosure. In the third embodiment, the abutting column 118 of the stand member 110 is also omitted.

As shown in FIG. 13 and FIG. 14, the latch device 140 includes at least one stop pin 142 and an actuator 144, and at least one stop pin 142 and the actuator 144 are movable. The actuator 144 is a telescopic device disposed on the base 120. The stop pin 142 is disposed on the telescopic device. The telescopic device is configured to drive the stop pin 142 to stretch and retract, so that the stop pin 142 is embedded into the limiting notch 134a through a perforation 124a of the pivot portion 124; Alternatively, the telescopic device is capable of driving the stop pin 142 to escape from the limiting notch 134a. The telescopic device, such as a mechanism that allows a pen core to stretch and retract through pressing, may be found in general writing tools. Same as the second embodiment, the perforation 124a is configured corresponding to the limiting notch 134a; When the mounting plate 132 is perpendicular to the planar surface S, the perforation 124a overlaps the limiting notch 134a, so that the stop pin 142 can extend through the perforation 124a to be embedded into the limiting notch 134a.

As shown in FIG. 13 and FIG. 14, in a specific embodiment, the telescopic device (that is, the actuator 144) further includes a rotatory disc 146a, a stop pin disc 146b, a pressing button 146c, and a compression spring 146d. The rotatory disc 146a is pivotally connected to the pivot portion 124 of the base 120, and the stop pin disc 146b is disposed between the rotatory disc 146a and the pivot portion 124, so as to be driven by the rotatory disc 146a to move in an axial direction. The pressing button 146c is disposed on an other side of the rotatory disc 146a, and the pressing button 146c and the rotatory disc 146a are connected through a cam mechanism. The compression spring 146d extends through the stop pin disc 146b and the pressing button 146c to be compressed between the pivot portion 124 and the pressing button 146c. The stop pin 142 is disposed on the stop pin disc 146b, and the stop pin 142 normally extends through the perforation 124a to be embedded into the limiting notch 134a.

As shown in FIG. 15, FIG. 16, FIG. 17, and FIG. 18, after the pressing button 146c is pressed, the rotatory disc 146a and the stop pin disc 146b are driven to move through linkage of the cam mechanism. Therefore, after the pressing button 146c is pressed, the stop pin 142 can be driven to stretch and retract, so as to cause the stop pin 142 to be embedded into or escape from the limiting notch 134a through the perforation 124a, thereby fixing or releasing the pivot member 130.

Figure 19:
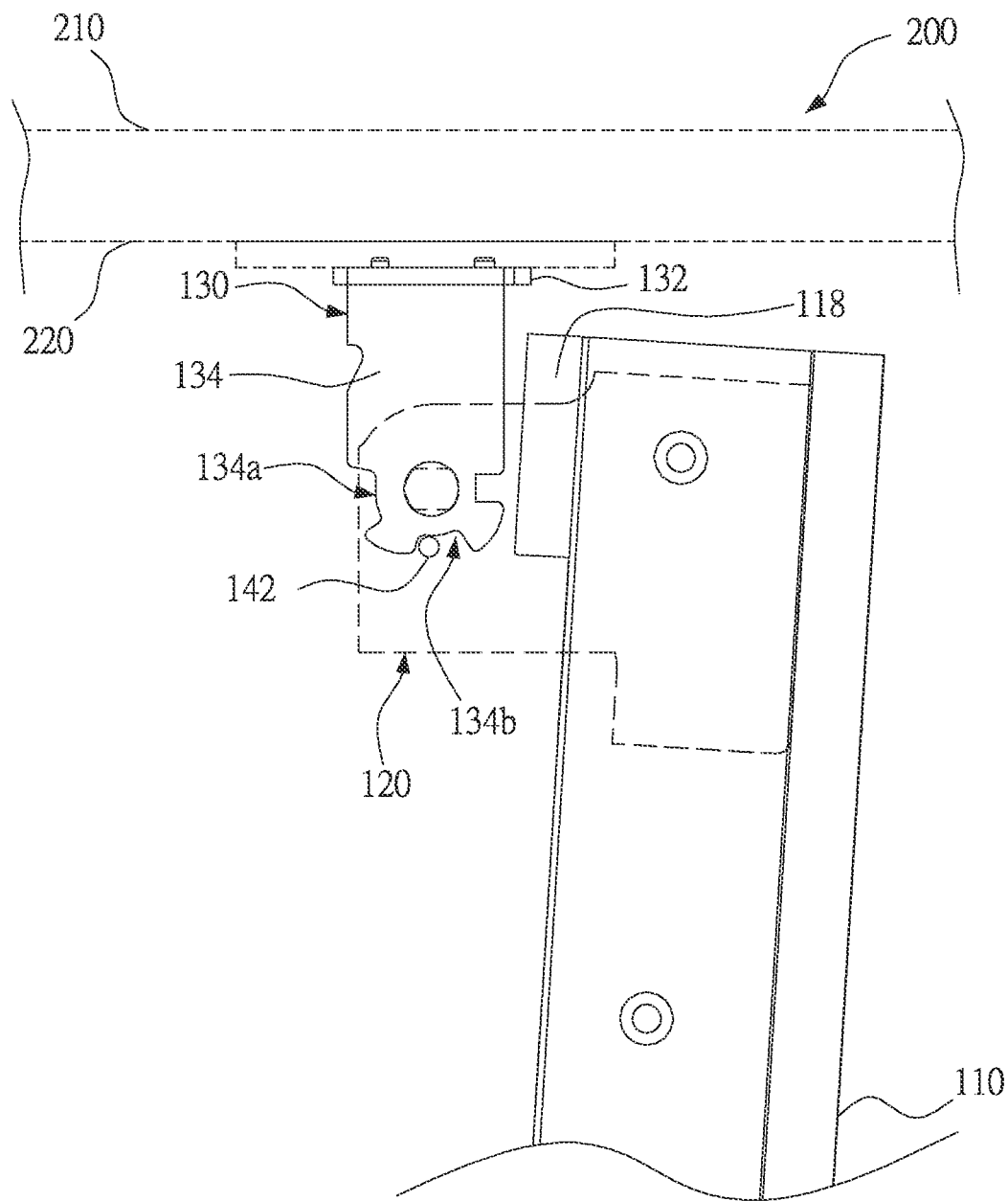
FIG. 19 is a side view of some elements according to a variation of the instant disclosure.

Referring to FIG. 19 again, in the second and third embodiments, the pivot plate 134 further includes a fixing notch 134b. When the mounting plate 132 is parallel to the planar surface S, the stop pin 142 is embedded into the fixing notch 134b to temporarily fix the display 200, so that the display 200 can be stably maintained in a horizontal state, thereby facilitating insertion of various connection lines.

By virtue of the display stand holder 100 of the instant disclosure, the display 200 can still be effectively limited to tilt frontward and rearward by limited angles during normal use. When an electrical signal connector needs to be inserted or removed, the display 200 can be flipped to a horizontal state only through limiting of the stop pin 142, so as to help a user insert and remove the electrical signal connector without a need to move and turnover the display 200 to insert the electrical signal connector. After the insertion of the electrical signal connector is completed, the pivot member 130 may be rotated again to restore a vertical state of the display 200, and the base 120 may be lowered to adjust the display 200 to a designated position on the stand member 110. The stop pin 142 is simple to operate, and can be quickly fastened or released.

What is claimed is:

1. A display stand holder configured to be disposed on a planar surface, comprising:
    a stand member configured to be disposed on the planar surface, wherein the stand member comprises an upper end and a lower end, wherein the lower end is configured to be disposed on the planar surface, so that the stand member is vertically disposed on the planar surface;
    a base slidably disposed in the stand member;
    a pivot member comprising a mounting plate and at least one pivot plate, wherein the at least one pivot plate perpendicularly extends from the mounting plate, comprises a limiting notch, and is pivotally connected to the base; and
    a latch device disposed in the base and comprising a stop pin and an actuator, and the stop pin and the actuator are movable, wherein the stop pin is normally embedded into the limiting notch to limit a range of rotation of the pivot member relative to the base, and the actuator is configured to push the stop pin to escape from the limiting notch, allowing the pivot member to further rotate to cause the mounting plate to be parallel to the planar surface.

2. The display stand holder according to claim 1, wherein the base comprises a sliding portion and at least one pivot portion, wherein the sliding portion is slidably disposed in the stand member, the at least one pivot portion extends from the sliding portion, and the at least one pivot plate is pivotally connected to the pivot portion.

3. The display stand holder according to claim 2, wherein the stand member further comprises a sliding guide portion, wherein the sliding portion is slidably disposed in the sliding guide portion.

4. The display stand holder according to claim 3, wherein the sliding guide portion is a long groove, wherein the sliding portion is accommodated in the long groove.

5. The display stand holder according to claim 1, further comprising a positioning device configured to fix the base at a designated position.

6. The display stand holder according to claim 1, wherein the actuator comprises a sliding block and an elastic member, wherein the sliding block is slidably disposed in the base, the elastic member is normally compressed between the sliding block and the base to push the sliding block toward the upper end, and the stop pin is disposed on the sliding block, wherein when the mounting plate is perpendicular to the planar surface, the stop pin is movable toward the upper end to be embedded into the limiting notch.

7. The display stand holder according to claim 6, further comprising an abutting column disposed on the stand member and corresponding to the upper end, wherein when the base is moved to the upper end, the abutting column abuts against the sliding block, so as to cause the stop pin to escape from the limiting notch.

8. The display stand holder according to claim 6, wherein the base comprises at least one guiding slot, and the sliding block comprises at least one guiding post slidably disposed in the at least one guiding slot.

9. The display stand holder according to claim 2, wherein the actuator further comprises:
an elastic piece having one end disposed on the base and an other end on which the stop pin is disposed, wherein the elastic piece is disposed on an outer side of the pivot portion, so that the stop pin is aligned to a perforation of the pivot portion, and the elastic piece is spaced apart from the pivot portion by a distance; and
a sliding switching member movably disposed on the base to be moved between a pressed position and a released position on the base, wherein the sliding switching member comprises a positioning rod and an abutting rod, wherein the abutting rod is located between the elastic piece and the pivot portion, and the positioning rod is configured corresponding to the stop pin; wherein
when the sliding switching member is in the pressed position, the positioning rod normally presses the elastic piece toward the pivot portion, so that the stop pin protrudes inside the pivot portion through the perforation so as to be embedded into the limiting notch, and when the sliding switching member is moved to the released position, the positioning rod is detached from the elastic piece, so that the abutting rod is moved toward the stop pin to push the elastic piece away from the pivot portion so as to cause the stop pin to escape from the limiting notch.

10. The display stand holder according to claim 9, wherein the positioning rod comprises an inclined guiding surface corresponding to the end of the elastic piece on which the stop pin is disposed, wherein when the sliding switching member is moved toward the pressed position, the end of the elastic piece on which the stop pin is disposed comes into contact with the inclined guiding surface, so that the elastic piece is guided to deform to enter a space between the positioning rod and the pivot portion.

11. The display stand holder according to claim 9, wherein the perforation is configured corresponding to the limiting notch, and when the mounting plate is perpendicular to the planar surface, the perforation overlaps the limiting notch.

12. The display stand holder according to claim 9, wherein the base further comprises an outer cover, wherein the sliding switching member is engaged to the outer cover to be movably disposed on the base, and the positioning rod and the abutting rod extend through at least one through hole of the outer cover.

13. The display stand holder according to claim 2, wherein the actuator is a telescopic device disposed in the base, wherein the stop pin is disposed on the telescopic device, and the telescopic device is configured to drive the stop pin to stretch and retract, so that the stop pin is embedded into the limiting notch through a perforation of the pivot portion, or the telescopic device is capable of driving the stop pin to escape from the limiting notch.

14. The display stand holder according to claim 13, wherein the perforation is configured corresponding to the limiting notch, and when the mounting plate is perpendicular to the planar surface, the perforation overlaps the limiting notch.

15. The display stand holder according to claim 13, wherein the pivot plate further comprises a fixing notch, wherein when the mounting plate is parallel to the planar surface, the stop pin is embedded into the fixing notch.

16. A display apparatus, comprising:
the display stand holder according to claim 1; and
a display comprising a front surface and a back surface, wherein the back surface is fixed to the mounting plate.

17. The display apparatus according to claim 16, wherein the base comprises a sliding portion and at least one pivot portion, wherein the sliding portion is slidably disposed in the stand member, the at least one pivot portion extends from the sliding portion, and the at least one pivot plate is pivotally connected to the pivot portion.

18. The display apparatus according to claim 17, wherein the stand member further comprises a sliding guide portion, wherein the sliding portion is slidably disposed in the sliding guide portion.

19. The display apparatus according to claim 18, wherein the sliding guide portion is a long groove, wherein the sliding portion is accommodated in the long groove.

20. The display apparatus according to claim 16, further comprising a positioning device configured to fix the base at a designated position.

21. The display apparatus according to claim 16, wherein the actuator comprises a sliding block and an elastic member, wherein the sliding block is slidably disposed in the base, the elastic member is normally compressed between the sliding block and the base to push the sliding block toward the upper end, and the stop pin is disposed on the sliding block, wherein when the mounting plate is perpendicular to the planar surface, the stop pin is movable toward the upper end to be embedded into the limiting notch.

22. The display apparatus according to claim 21, further comprising an abutting column disposed on the stand member and corresponding to the upper end, wherein when the base is moved to the upper end, the abutting column abuts against the sliding block, so as to cause the stop pin to escape from the limiting notch.

23. The display apparatus according to claim 21, wherein the base comprises at least one guiding slot, and the sliding block comprises at least one guiding post slidably disposed in the at least one guiding slot.

24. The display apparatus according to claim 17, wherein the actuator further comprises:
   an elastic piece having one end disposed on the base and an other end on which the stop pin is disposed, wherein the elastic piece is disposed on an outer side of the pivot portion, so that the stop pin is aligned to a perforation of the pivot portion, and the elastic piece is spaced apart from the pivot portion by a distance; and
   a sliding switching member movably disposed on the base to be moved between a pressed position and a released position on the base, wherein the sliding switching member comprises a positioning rod and an abutting rod, wherein the abutting rod is located between the elastic piece and the pivot portion, and the positioning rod is configured corresponding to the stop pin; wherein
   when the sliding switching member is in the pressed position, the positioning rod normally presses the elastic piece toward the pivot portion, so that the stop pin protrudes inside the pivot portion through the perforation so as to be embedded into the limiting notch, and when the sliding switching member is moved to the released position, the positioning rod is detached from the elastic piece, so that the abutting rod is moved toward the stop pin to push the elastic piece away from the pivot portion so as to cause the stop pin to escape from the limiting notch.

25. The display apparatus according to claim 24, wherein the positioning rod comprises an inclined guiding surface corresponding to the end of the elastic piece on which the stop pin is disposed, wherein when the sliding switching member is moved toward the pressed position, the end of the elastic piece on which the stop pin is disposed comes into contact with the inclined guiding surface, so that the elastic piece is guided to deform to enter a space between the positioning rod and the pivot portion.

26. The display apparatus according to claim 24, wherein the perforation is configured corresponding to the limiting notch, and when the mounting plate is perpendicular to the planar surface, the perforation overlaps the limiting notch.

27. The display apparatus according to claim 24, wherein the base further comprises an outer cover, wherein the sliding switching member is engaged to the outer cover to be movably disposed on the base, and the positioning rod and the abutting rod extend through at least one through hole of the outer cover.

28. The display apparatus according to claim 17, wherein the actuator is a telescopic device disposed in the base, wherein the stop pin is disposed on the telescopic device, and the telescopic device is configured to drive the stop pin to stretch and retract, so that the stop pin is embedded into the limiting notch through a perforation of the pivot portion, or the telescopic device is capable of driving the stop pin to escape from the limiting notch.

29. The display apparatus according to claim 28, wherein the perforation is configured corresponding to the limiting notch, and when the mounting plate is perpendicular to the planar surface, the perforation overlaps the limiting notch.

30. The display apparatus according to claim 28, wherein the pivot plate further comprises a fixing notch, wherein when the mounting plate is parallel to the planar surface, the stop pin is embedded into the fixing notch.

* * * * *